United States Patent
Lin et al.

(10) Patent No.: US 10,164,122 B2
(45) Date of Patent: Dec. 25, 2018

(54) SEMICONDUCTOR DEVICE WITH TRANSITION METAL DICHALOCOGENIDE HETERO-STRUCTURE

(71) Applicants: Taiwan Semiconductor Manufacturing Co., Ltd., Hsin-Chu (TW); National Taiwan University, Taipei (TW)

(72) Inventors: Shih-Yen Lin, Hsinchu (TW); Chi-Wen Liu, Hsinchu (TW); Chong-Rong Wu, New Taipei (TW); Xiang-Rui Chang, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/884,729

(22) Filed: Jan. 31, 2018

(65) Prior Publication Data
US 2018/0151752 A1 May 31, 2018

Related U.S. Application Data

(62) Division of application No. 15/169,451, filed on May 31, 2016, now Pat. No. 9,899,537.

(51) Int. Cl.
*H01L 21/02* (2006.01)
*H01L 29/786* (2006.01)
(Continued)

(52) U.S. Cl.
CPC .... *H01L 29/78696* (2013.01); *H01L 21/0262* (2013.01); *H01L 21/02568* (2013.01);
(Continued)

(58) Field of Classification Search
None
See application file for complete search history.

(56) References Cited

U.S. PATENT DOCUMENTS 9,460,919 B1 10/2016 Chueh et al.
9,577,049 B1 * 2/2017 Lin .................... H01L 29/45
(Continued)

OTHER PUBLICATIONS

Lam et al (Device Perfomrnace of Heterojunction Tunneling Field-Effect Transistors Based on Transition Metal Dichalcogenide Monolayer, IEEE Electron Device Letters, vol. 34, No. 10. Oct. 2013).*

(Continued)

*Primary Examiner* — Ali Naraghi
(74) *Attorney, Agent, or Firm* — Haynes and Boone, LLP

(57) ABSTRACT

A method includes depositing a first transition metal film having a first transition metal on a substrate and performing a first sulfurization process to the first transition metal film, thereby forming a first transition metal sulfide film. The method further includes depositing a second transition metal film having a second transition metal on the first transition metal sulfide film and performing a second sulfurization process to the second transition metal film, thereby forming a second transition metal sulfide film. The first and the second transition metals are different. The method further includes forming a gate stack, and source and drain features over the second transition metal sulfide film. The gate stack is interposed between the source and drain features. The gate stack, source and drain features, the first transition metal sulfide film and the second transition metal sulfide film are configured to function as a hetero-structure transistor.

13 Claims, 10 Drawing Sheets

(51) Int. Cl.
| | |
|---|---|
| *H01L 29/66* | (2006.01) |
| *H01L 29/24* | (2006.01) |
| *H01L 29/778* | (2006.01) |
| *H01L 29/267* | (2006.01) |
| *H01L 29/417* | (2006.01) |
| *H01L 29/16* | (2006.01) |

(52) U.S. Cl.
CPC .......... *H01L 29/1606* (2013.01); *H01L 29/24* (2013.01); *H01L 29/267* (2013.01); *H01L 29/41766* (2013.01); *H01L 29/66969* (2013.01); *H01L 29/778* (2013.01); *H01L 29/78618* (2013.01); *H01L 29/78648* (2013.01); *H01L 29/78681* (2013.01); *H01L 29/78684* (2013.01); *H01L 29/78687* (2013.01)

(56) References Cited

U.S. PATENT DOCUMENTS

| | | | |
|---|---|---|---|
| 9,590,044 B2 | 3/2017 | Rihl et al. | |
| 2011/0297961 A1* | 12/2011 | Bunin | H01L 29/42316 257/76 |
| 2015/0083206 A1 | 3/2015 | Novoselov et al. | |
| 2016/0093491 A1* | 3/2016 | Choi | H01L 21/02485 438/151 |
| 2016/0293713 A1* | 10/2016 | Nechay | H01L 29/7851 |
| 2017/0098661 A1 | 4/2017 | Rakshit et al. | |
| 2017/0345944 A1 | 11/2017 | Lin et al. | |

OTHER PUBLICATIONS

Amin et al (Hetrostructures of transition metal dichalcogenides, Physical Review B 92, 075439 (2015)).*

Meng-Yu Lin, Chung-En Chang, Cheng-Hung Wang, Chen-Fung Su, Chi Chen, Si-Chen Lee, and Shih-Yen Lin, "Toward epitaxially grown two-dimensional crystal hetero-structures: Single and double MoS2/graphene hetero-structures by chemical vapor depositions." AIP Applied Physics Letters, 105, 073501 (2014) Aug. 18, 2014, pp. 073501-1 through 073501-5.

Chong-Rong Wu, Xiang-Rui Chang, Shu-Wei Chang, Chung-En Chang, Chao-Hsin Wu and Shih-Yen Lin, "Multilayer MoS2 prepared by one-time and repeated chemical vapor depositions: anomalous Raman shifts and transistors with high ON/OFF ratio." IOP Science, J. Phys: Appl, Phys 48 (2015) 435101 7 pages.

Carlo M. Orofeo, Satoru Suzuki, Yoshiaki Sekine, and Hiroki Hibino, "Scalable synthesis of layer-controlled WS2 and MoS2 sheets by sulfurization of thin metal films." AIP Applied Physics Letters, 105, 083112 (2014) Aug. 26, 2014, pp. 083112-1 through 083112-5.

Xiaoping Hong, Jonghwan Kim, Su-Fei Shi, Yu Zhang, Chenhao Jin, Yinghui Sun, Sefaattin Tongay, Junqiao Wu, Yanfeng Zhang and Feng Wang, "Ultrafast charge transfer in atomically thin $MoS_2/WS_2$ heterostructures." Nature Nanotechnology, Aug. 24, 2014, pp. 682 to 686.

* cited by examiner

US 10,164,122 B2

SEMICONDUCTOR DEVICE WITH TRANSITION METAL DICHALOCOGENIDE HETERO-STRUCTURE

PRIORITY

This is a divisional of U.S. application Ser. No. 15/169,451 filed on May 31, 2016, the entire disclosure of which is herein incorporated by reference.

BACKGROUND

In semiconductor technology, integrated circuits are formed on a substrate using various technologies including photolithography process, etching and deposition. Compared with the half-century development of Si and compound semiconductors, the study of two-dimensional crystal graphene with its first discovery at 2004 is still at a very early stage. Nevertheless, the theoretically predicted high mobility of graphene has already emerged its possible application in high-speed electronics. Owing to its wide absorption wavelengths and short carrier lifetime, graphene also has strong potential for optical devices.

However, both the device structure and corresponding method making the same are still long way to go. There are various issues to be solved and challenges to overcome. Chemical vapor deposition (CVD) is now a promising method for large-area and uniform 2-D crystal growth. Graphene and transition metal dichalcogenides (TMDs) have been demonstrated by using CVD. However, for different 2-D crystals, different precursors have to be chosen located and adopted for growth. For example, $CH_4$ is used as precursor for graphene growth. In this case, if 2-D crystal hetero-structures are to be prepared for practical applications, suitable precursors have to be located for different 2-D crystals, which will be an issue in the advanced researches for unknown materials. On the other hand, CVD technique is advantageous for large-area film growth. However, it is difficult to achieve selective growth by using this method. The possible high dependence of 2-D crystal growth on certain substrates such as sapphire has also limited the applications of these materials. Film transferring procedures have to be conducted to transfer the 2-D crystals from sapphire to desired substrates. Furthermore, the device structure made from 2-D crystals is not mature and need to be adjusted and tuned to overcome the issues associated with the 2-D crystals and maximize the use of the 2-D crystals. Therefore, the present disclosure provides a semiconductor structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
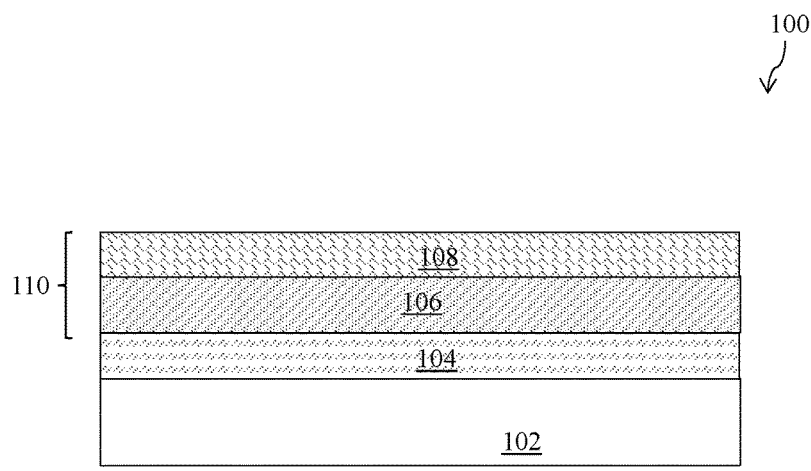
FIGS. 1A, 2A, 3A, and 4A illustrate sectional views of a semiconductor device at various fabrication stages in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A hetero-structure field effect transistor (FET) and the method of forming the same are provided in accordance with various exemplary embodiments. The intermediate stages of forming the hetero-structure FET are illustrated. The variations of the embodiments are discussed. Throughout the various views and illustrative embodiments, like reference numbers are used to designate like elements.

Embodiments such as those described herein provide a hetero-structure FET with various transition metal chalcogenide layers stacked together. Especially, the 2-D transition metal chalcogenide provide a range of electrical materials including dielectric material, semiconductor and conductor. The use of the transition metal chalcogenide allows forming hetero-structure FET devices with various advantages associated with the characteristics of the 2-D crystals, such as minimized vertical sizes and enhanced electrical performance. The present disclosure provides various structures of field-effect transistors and a method to integrate various technologies to fabricate the devices in accordance with various embodiments. Particularly, the transition metal chalcogenide layers each are formed by a procedure that includes transition metal deposition and the sulfurization. The disclosed approach also provides fabrication capabilities to make hetero-structure FETs with various designs, configurations and layouts. In various embodiments, the semiconductor device has a single gate stack, double gate stacks, single channel, or multiple channels.

FIGS. 1A, 2A, 3A, and 4A illustrate sectional views of a semiconductor device 100 at various fabrication stages in accordance with some embodiments. FIGS. 1B, 2B, 3B, and 4B illustrate top views of the semiconductor device 100 at various fabrication stages in accordance with some embodiments.

Figure 1B:
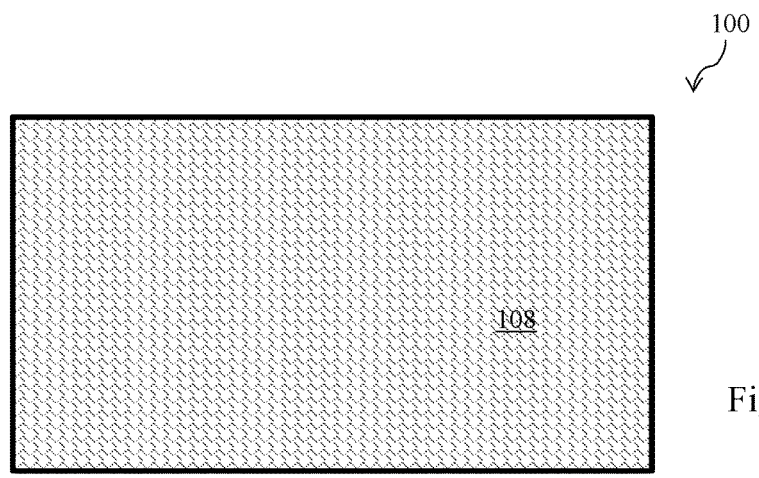
FIGS. 1B, 2B, 3B, and 4B illustrate top views of the semiconductor device at various fabrication stages in accordance with some embodiments.

Referring to FIGS. 1A and 1B, in the illustrated embodiment, the semiconductor device 100 includes a substrate 102. In some embodiments, the substrate 102 includes silicon. Alternatively, the substrate 102 may include sapphire, silicon carbide or other suitable material. In some embodiments, the substrate 102 may include other elementary semiconductor such as germanium in accordance with some embodiments. In some embodiments, the substrate 102 additionally or alternatively includes a compound semiconductor such as silicon carbide, gallium arsenic, indium arsenide, and indium phosphide. In some embodiments, the substrate 102 includes an alloy semiconductor such as silicon germanium, silicon germanium carbide, gallium arsenic phosphide, and gallium indium phosphide. The substrate 102 may include other functional features such as a resistor, a capacitor, diode, transistors, such as field effect transistors (FETs). The substrate 102 may include lateral isolation features configured to separate various devices formed on the substrate 102.

A dielectric material layer 104 may be formed on the substrate 102, formed by a suitable process. In the present embodiment, a dielectric material layer 104 includes silicon oxide that may be formed by deposition, spin-on glass, thermal oxidation or other suitable technique. In some examples, when the substrate 102 includes silicon, the dielectric material layer 104 is formed by thermal oxidation. In furtherance of the examples, the thermal oxidation may include dry oxidation with oxygen, wet oxidation with water or steam oxidation with oxygen and hydrogen. In a particular example, the thermal oxidation includes heating the substrate 102 to a higher temperature, such as a temperature between 800° C. and 1300° C. while an oxygen gas is provided to the substrate 102. Thus, the oxygen is reacted with silicon to form silicon oxide. In other examples, the silicon oxide may be formed by a spin-on glass procedure that includes spin-on coating the substrate 102 with spin-on glass (SOG) fluid and then curing the SOG fluid at high temperature to form silicon oxide layer on the substrate 102. In other examples, the silicon oxide may be formed chemical vapor deposition (CVD) using a suitable precursor, such as silane ($SiH_4$) or tetraethoxysilane or $Si(OC_2H_5)_4$ (TEOS).

Still referring to FIGS. 1A and 1B, a transition metal dichalcogenide (TMD) material stack 110 is formed on the substrate 102, particularly disposed on the dielectric material layer 104 in the present example. The TMD stack 110 includes at least two different transition metal dichalcogenide layers to have a hetero-structure, so also referred to as hetero-structure material stack 110. The hetero-structure material stack 110 may alternatively include other two-dimensional (2-D) crystals, such as graphene. Each material layer of the hetero-structure material stack 110 may include a single atomic layer crystal or multiple atomic layer crystal. In the present embodiment, each film of the hetero-structure material 110 is in a crystalline structure.

In the present embodiment as illustrated in FIGS. 1A and 1B, the TMD stack 110 includes a first TMD layer as a barrier layer 106, disposed on the dielectric material layer 104; and a second TMD layer as a channel layer 108, disposed on the barrier layer 106. The first TMD layer includes a first transition metal and the second TMD layer includes a second transition metal, wherein the second transition metal (such as molybdenum) is different from the first transition metal (such as tungsten).

In some examples, the barrier layer 106 includes tungsten disulfide ($WS_2$) and the channel layer 108 includes molybdenum disulfide ($MoS_2$). In furtherance of the examples, the barrier layer 106 may have a thickness from 0.2 nm to 1 nm and the channel layer 106 may have a thickness from 0.5 nm to 2 nm.

The formation of the barrier layer 106 and the channel layer 108 includes deposition and sulfurization, so that the fabrication has more freedom to tune and is more adaptive to different substrate and material integration. Particularly, the formation of a TMD layer includes transition metal deposition using physical vapor deposition (PVD) and performing a sulfurization process to the transition metal, thereby forming the corresponding TMD layer. For example, the transition metal deposition may use radio-frequency (RF) sputtering in a PVD system with a target of the corresponding transition metal. In another example, the sulfurization includes: evaporating sulfur powder; and reacting the sulfur with the transition metal at elevated temperature to form the corresponding TMD layer.

In the present example, the formation of the barrier layer 106 includes depositing tungsten (W) using RF sputtering with a tungsten target to form a tungsten layer on the substrate 102; and further includes performing a sulfurization process to the tungsten layer to form tungsten disulfide. During the sulfurization process, an amount of sulfur powder is heated to a temperature ranging from 700° C. and 900° C. for suitable duration (such as 20 minutes to 40 minutes for example), so that the sulfur powder is evaporated and reacted with the tungsten layer to form a tungsten disulfide layer having a proper thickness (such as about 0.5 nm in one example). The amount of sulfur powder used in the sulfurization process is determined according to the thickness of the formed tungsten disulfide layer and the area of the substrate 102. The amount of the sulfur powder ranges from 0.5 g to 2 g, or about 1 g in various examples. During the sulfurization, the heating may be implemented in a furnace using electric heating.

In the present example, the formation of the channel layer 108 includes depositing molybdenum (Mo) using RF sputtering with a molybdenum target to form a molybdenum layer on the substrate 102 (specifically on the tungsten disulfide barrier layer 106); and further includes performing a sulfurization process to the molybdenum layer to form molybdenum disulfide. During the sulfurization process, an amount of sulfur powder is heated to a temperature ranging from 700° C. and 900° C. for suitable duration (such as 20 minutes to 40 minutes for example), so that the sulfur powder is evaporated and reacted with the molybdenum layer to form a molybdenum disulfide layer having a proper thickness (such as about 1 nm in one example). The amount of sulfur powder used in the sulfurization process is determined according to the thickness of the formed molybdenum disulfide layer and the area of the substrate 102. The amount of the sulfur powder ranges from 0.5 g to 3 g, or about 1.5 g in various examples.

In the present illustrative embodiment, even though the hetero-structure material stack 110 only includes two layers: the barrier layer 106 and the channel layer 108, the hetero-structure material stack 110 may include more two TMD layers or other 2-D crystals, which will be described later according to different embodiments. Furthermore, each of the TMD layers may have multiple atomic layers with a proper thickness. It may only include a single atomic layer.

Figure 2A:
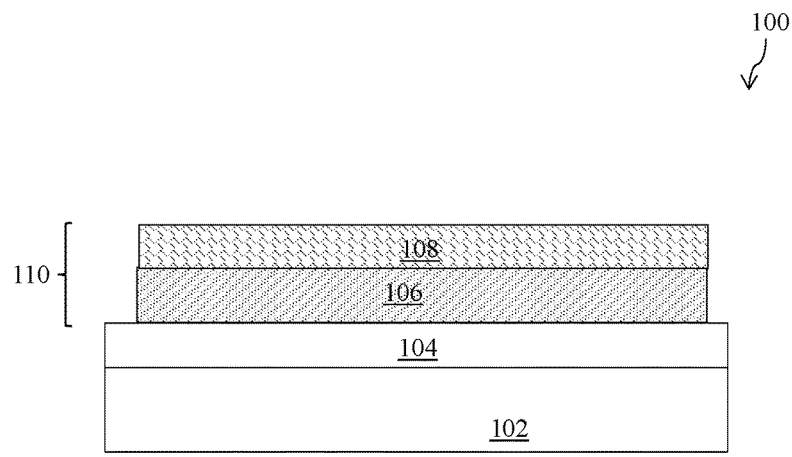
Figure 2B:
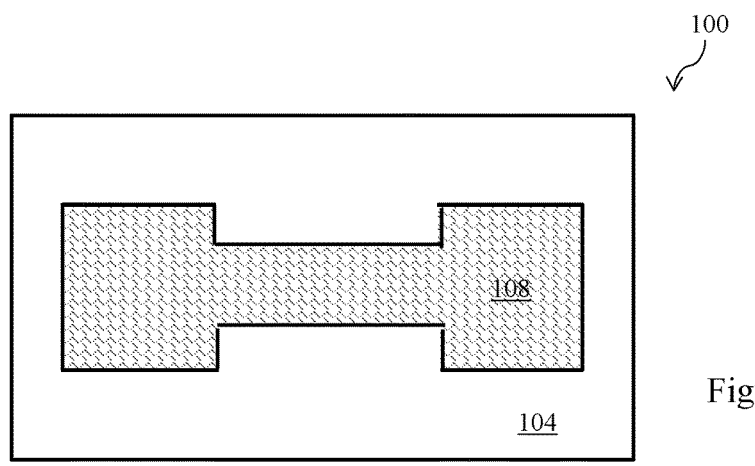

Referring to FIGS. 2A and 2B, the hetero-structure material stack 110 is patterned according to the design of the semiconductor device 100, which includes its geometry, dimensions, and configurations relative to other components and devices in the integrated circuit. The patterning procedure of the hetero-structure material stack 110 may include lithography process and etching. In some examples, the lithography process may include forming a photoresist (resist) layer over the substrate 102; exposing the resist layer to a pattern (such as a pattern predefined on a photomask), performing post-exposure baking; and developing the resist layer to form the patterned resist layer. In various examples, the etching process can include dry etching, wet etching, reactive ion etching (RIE), and/or other suitable processes. The etching process may include multiple etch steps each with a respective etchant to effectively and selectively etch one layer of the hetero-structure material stack 110. For example, when the hetero-structure material stack 110 includes three barrier layers and two channel layers interleaved, the etching process may include five corresponding etching steps: three etching steps with a first etchant to selectively etch the barrier material; and two etching steps with a second etchant to selectively etch the channel material. Alternatively, the etching process only includes one etching step to effectively etching both the barrier and channel materials. Overall, the lithography process forms a patterned resist layer; and the etching process is applied to the hetero-structure material stack 110 through an opening the patterned resist layer, thereby formed the patterned hetero-structure material stack 110. Afterward, the patterned resist layer may be removed by wet stripping or plasma ashing. In an alternative embodiment, a hard mask layer may be used to pattern the hetero-structure material stack 110. In furtherance of this embodiment, a hard mask layer (such as silicon nitride or silicon oxide) is deposited over the substrate 102; a patterned resist layer is formed on the hard mask layer by a lithography process; a first etching process is applied to transfer the pattern from the patterned resist layer to the hard mask layer; and then the hetero-structure material stack 110 is etched by a second etching process through the opening of the patterned hard mask.

Figure 3A:
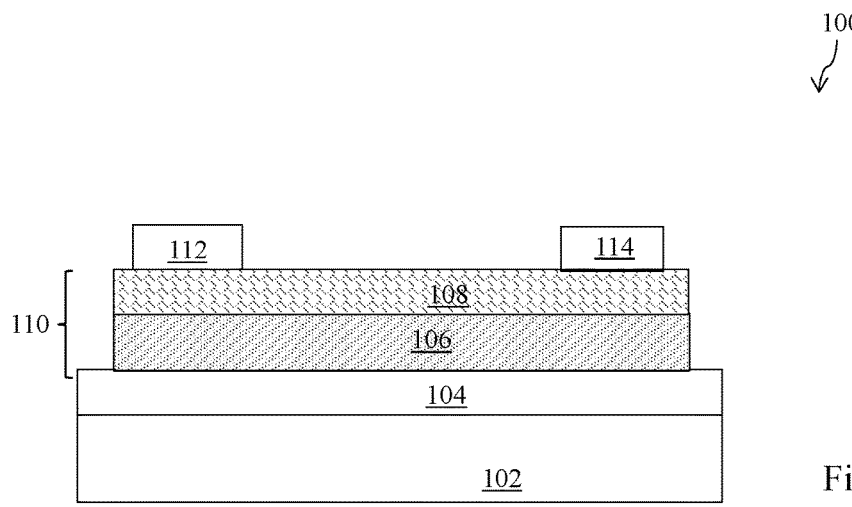
Figure 3B:
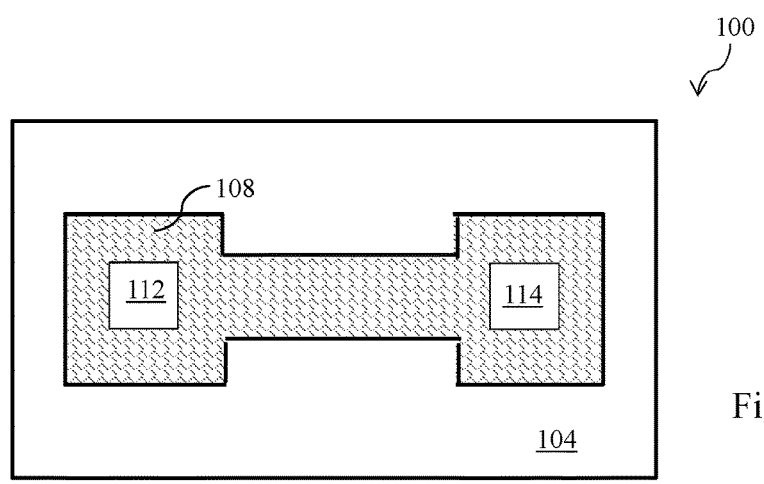

Referring to FIGS. 3A and 3B, a source feature 112 and a drain feature 114 are formed on the hetero-structure material stack 110. In the present embodiment, the hetero-structure material stack 110 is patterned to have two enlarged end portions; and the source and drain (S/D) features are designed to land on the enlarged end portions, as illustrated in FIG. 3B. The source and drain features are conductor features and are made of a conductive material, such as metal, metal alloy, or doped semiconductor material. In some embodiments, the source and drain features are configured such that they are electrically connected to the channel layer. The formation of the source and drain features may include deposition and patterning, wherein the patterning further includes lithography process and etching.

In the present embodiment, the source feature 112 and the drain feature 114 include a titanium film and a gold film disposed on the titanium film, designed for reduced contact resistance and better material integration in terms of performance and fabrication. The titanium film may be formed by PVD or plating in some examples. Similarly, the gold film may be formed by PVD or plating. After depositions, a patterning process is applied to the titanium film and gold film to pattern the both, thereby forming the source feature 112 and drain feature 114. As noted above, the patterning process includes lithography process and etching. Alternatively, the source and drain features may be formed by a damascene process. In the damascene process, a dielectric material (such as silicon oxide, low k dielectric material or a combination) is deposited on the substrate; a patterning process is applied to the dielectric material to form trenches; and one or more conductive material (such as titanium and gold) is filled in the trenches, thereby forming the source and drain features. In other embodiment, the source and drain features may be formed after the formation of the gate stack, which will be described later. In another embodiment, the source and drain features may only include one metal or metal alloy such as aluminum or tungsten.

Figure 4A:
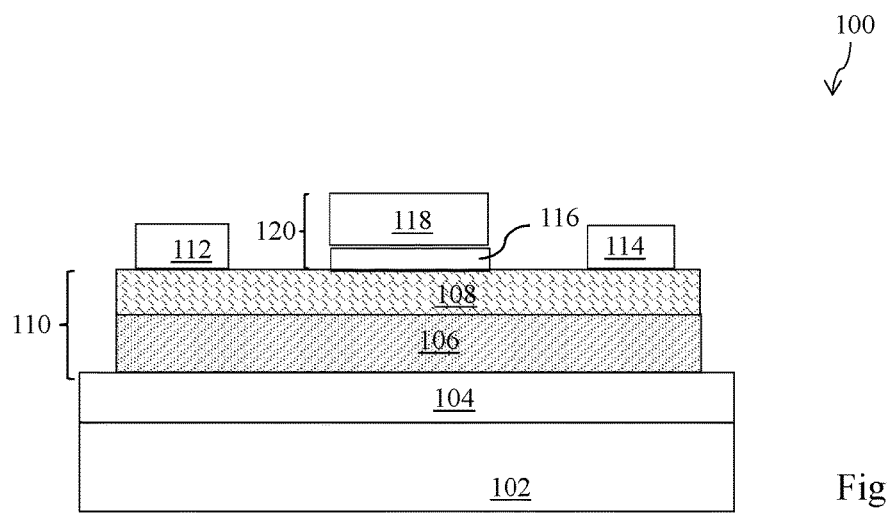
Figure 4B:
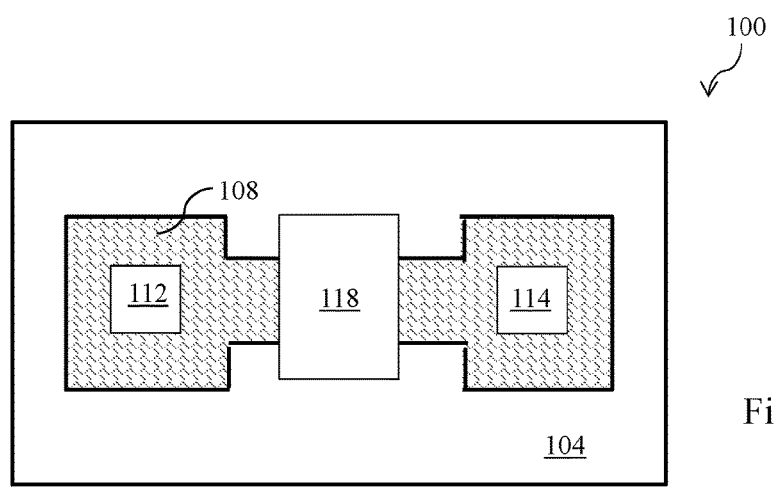

Referring to FIGS. 4A and 4B, a gate stack 120 is formed on the substrate 102 by a procedure that includes depositions and patterning. In the present embodiment, the gate stack 120 is disposed on the channel layer 108 and is horizontal interposed between the source and drain features. The gate stack 120 includes a gate dielectric layer 116; and a gate electrode layer 118 disposed on the gate dielectric layer 116.

The gate dielectric layer 116 may include one or more dielectric films with proper thickness designed and configured for better device performance. For examples, the gate dielectric layer 116 includes one or more dielectric material, such as silicon oxide, silicon nitride, silicon oxynitride, high k dielectric material or a combination thereof. A high-k dielectric layer is a dielectric material having the dielectric constant higher than that of thermal silicon oxide, about 3.9. A high k dielectric material may include a metal oxide, a metal nitride, a metal silicate, or a combination thereof. For example, the high k dielectric material includes hafnium oxide or zirconium oxide. The high-k dielectric layer is formed by a suitable process such as atomic layer deposition (ALD). Other methods to form the high-k dielectric material layer include metal-organic chemical vapor deposition (MOCVD), PVD, UV-Ozone Oxidation or molecular beam epitaxy (MBE).

The gate electrode layer 118 includes one or more conductive layer. The conductive layer may include metal, metal silicide, metal alloy, doped silicon or other suitable conductive material in accordance with some embodiments. The gate electrode layer 118 may include multiple conductive material films properly designed for enhanced device performance and material integration. In some embodiments, the conductive layer includes a metallic material (such as silver, aluminum, copper, tungsten, or nickel), metal alloy (such as aluminum copper alloy), or metal compound (such as titanium nitride or tantalum nitride). The conductive layer may be formed by PVD, plating, other suitable technology, or a combination thereof.

After the depositions of the gate dielectric layer 116 and the gate electrode layer 118, the gate material layers are patterned to form the gate stack 120 by a patterning procedure that includes lithography process and etching. In some embodiments, a hard mask layer may be used. In this case, the patterning procedure includes depositing a hard mask layer; forming a patterned resist layer on the hard mask layer; transferring the pattern from the patterned resist layer to the hard mask layer by first etching; and transferring the pattern from the patterned hard mask layer to the gate stack by second etching.

Figure 5:
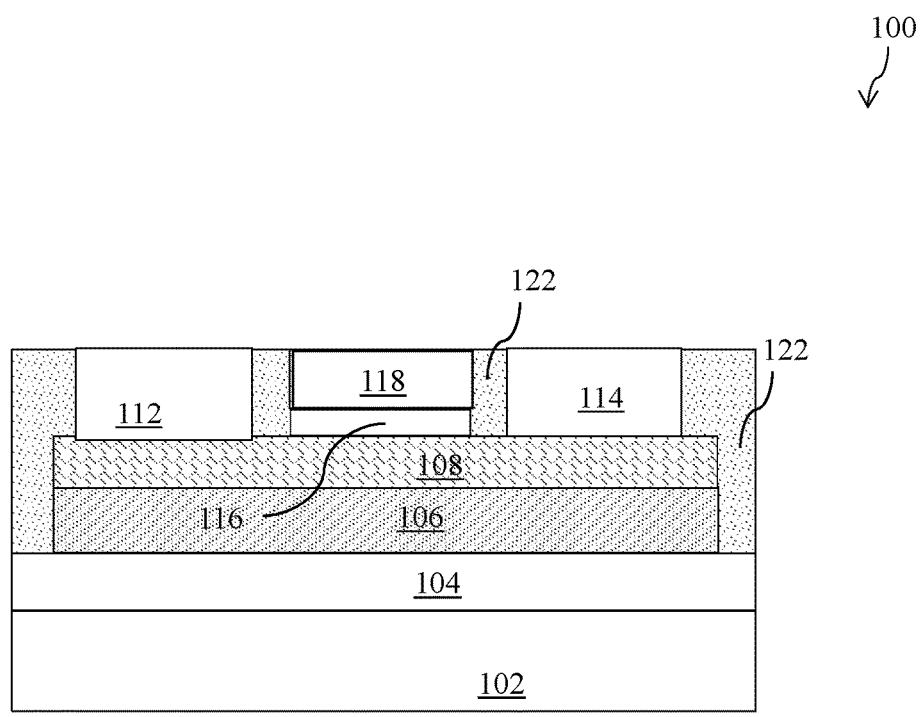
FIGS. 5, 6 and 7 illustrate sectional views of a semiconductor device in accordance with some embodiments.

The gate stack 120 and the S/D features may be formed by a different procedure, such as one procedure described below with reference to FIG. 5 in a sectional view. The gate stack 120 is first formed by deposition and etching. A dielectric material layer 122 is formed on the substrate 102, and the sidewalls of the gate stack 120 by deposition. The dielectric material layer 122 may include silicon oxide, silicon nitride, low k dielectric material layer, other suitable dielectric material or a combination thereof. The low k dielectric material is dielectric material having a dielectric constant less than 3.9. In various examples, the low k dielectric material includes fluorine doped silicon dioxide, carbon doped silicon dioxide, porous silicon dioxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, or other newly developed low k dielectric material. After the deposition of the dielectric material layer 122, a polishing process, such as chemical mechanical polishing (CMP) process may be applied to remove excessive dielectric material and planarize the top surface.

Afterward, a process similar to a damascene process is applied to form the S/D features. Particularly, the dielectric material layer 122 is patterned to form trenches by a patterning process that includes lithography process and etching. One or more metal is filled in the trenches to form the S/D features by deposition, such as CVD or high density plasma CVD. Another CMP process may be further applied to the metal to remove the excessive metal and planarize the top surface.

Thus formed semiconductor device 100 includes channel, S/D features and gate stack, configured to function as a hetero-structure transistor with high mobility with various applications, such as high frequency circuit or high speed circuit.

Figure 6:
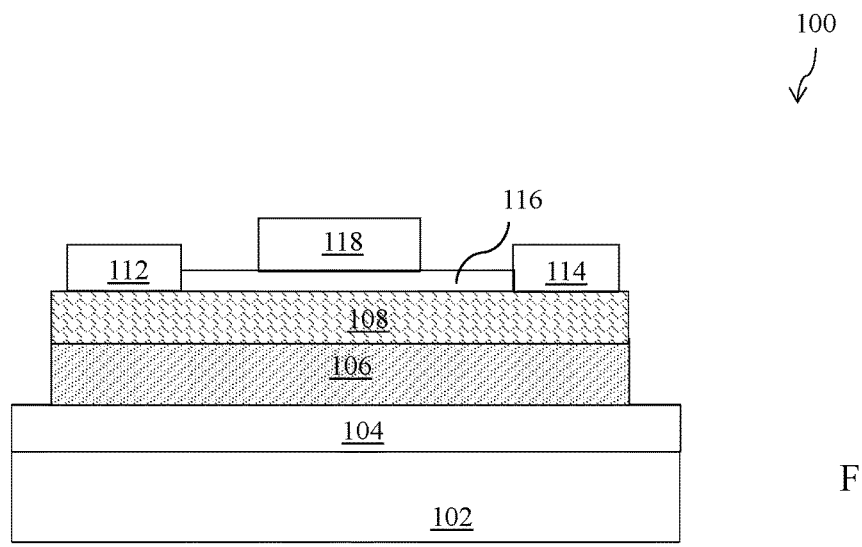
Figure 7:
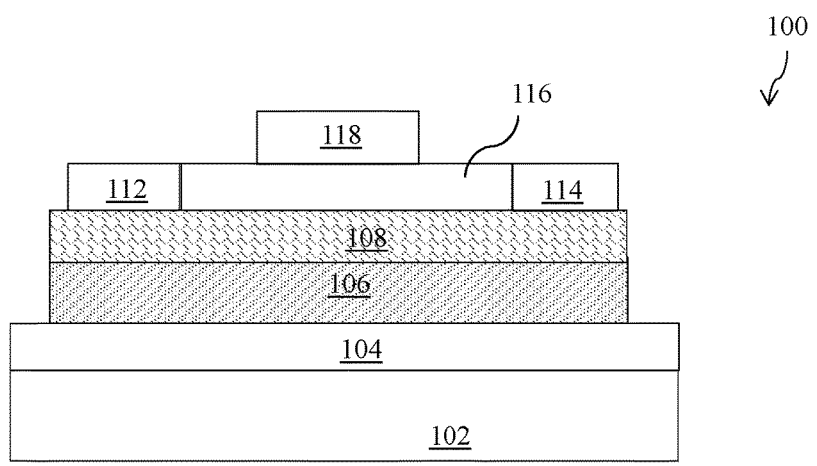

The semiconductor device 100 may have different configurations for different applications. For examples, the gate dielectric layer 116 may be differently patterned, such as one illustrated in FIG. 6, or may have a different thickness such as one illustrated in FIG. 7.

Figure 8:
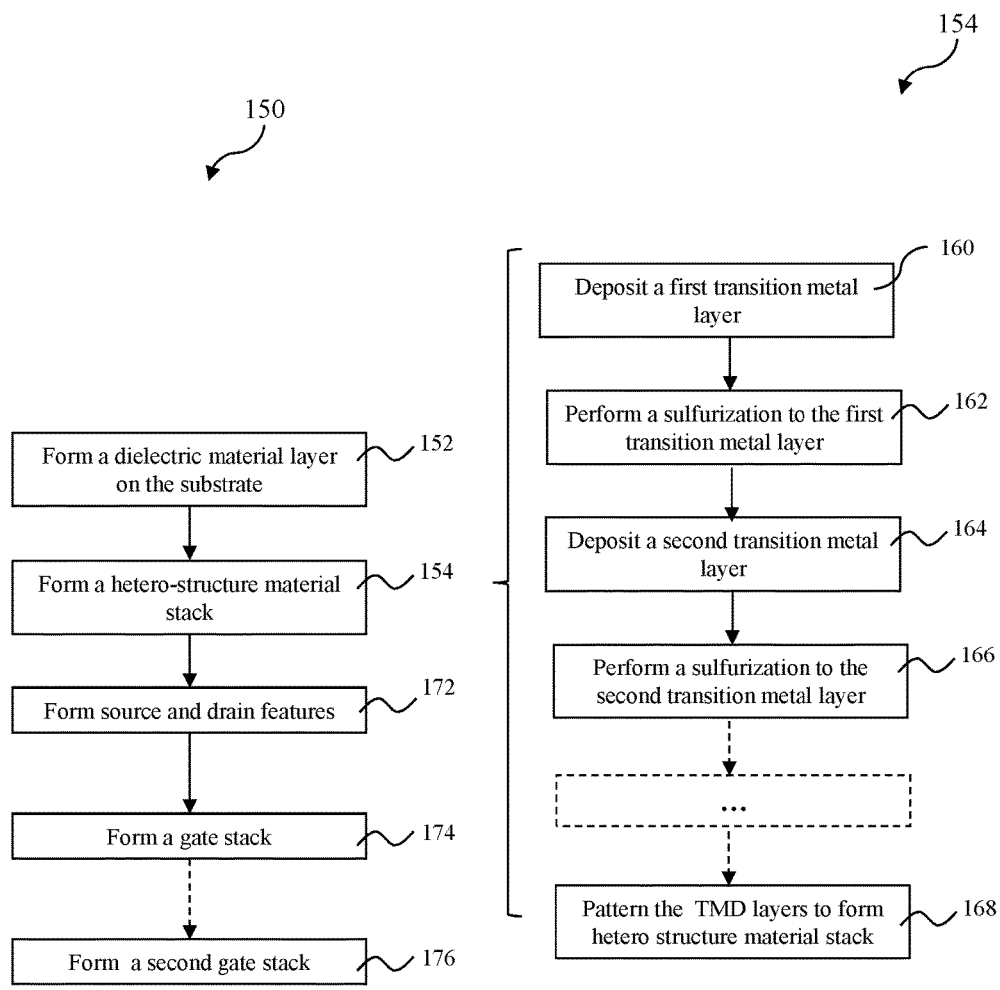
FIG. 8 is a flowchart of a method for making a semiconductor device, in accordance with some embodiments.

FIG. 8 illustrates a flowchart of a method 150 making the semiconductor device 100, constructed in accordance with some embodiments. The method 150 is described with reference to FIGS. 1A through 12B. The method 150 may include an operation 152 to form a dielectric material layer 104 on the substrate 102. The dielectric material layer 104 may include silicon oxide, silicon nitride, silicon oxynitride, or other suitable dielectric material. In the present embodiment, the substrate 102 includes silicon and the dielectric material layer 104 includes silicon oxide, which may be formed by thermal oxidation or CVD.

The method 150 includes an operation 154 to form a hetero-structure material stack 110 on the substrate 102. In the operation 154, the hetero-structure material stack 110 is formed by deposition, sulfurization and patterning. Particularly, depending on specific structure of the hetero-structure material stack 110, deposition and sulfurization may be implemented multiple times to form respective TMD films, such as one or more barrier layer and one or more channel layer. The operation 154 is further described with more details, as illustrated by a flowchart at the right side of FIG. 8.

The operation 154 includes a sub-operation 160 to deposit a first transition metal layer (such as tungsten), and a sub-operation 162 to perform a sulfurization process to the first transition metal, thereby forming a first TMD layer, such as the barrier layer 106 as illustrated in FIG. 1A. The deposition and sulfurization are described in FIGS. 1A and 1B, and will not be repeated.

The operation 154 includes a sub-operation 164 to deposit a second transition metal layer (such as tungsten), and a sub-operation 166 to perform a sulfurization process to the second transition metal, thereby forming a second TMD layer, such as the channel layer 108 as illustrated in FIG. 1A.

Figure 9A:
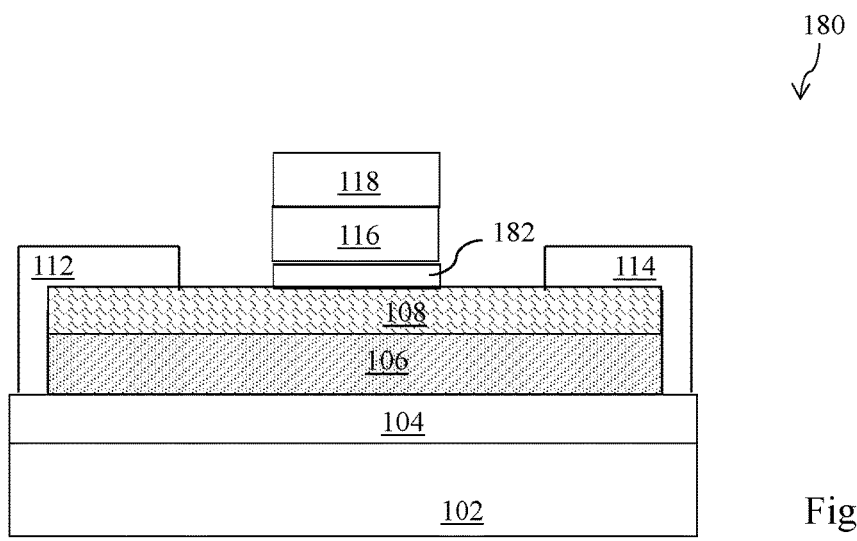
FIGS. 9A and 9B illustrate a sectional view and a top view, respectively, of a semiconductor device in accordance with some embodiments.
Figure 9B:
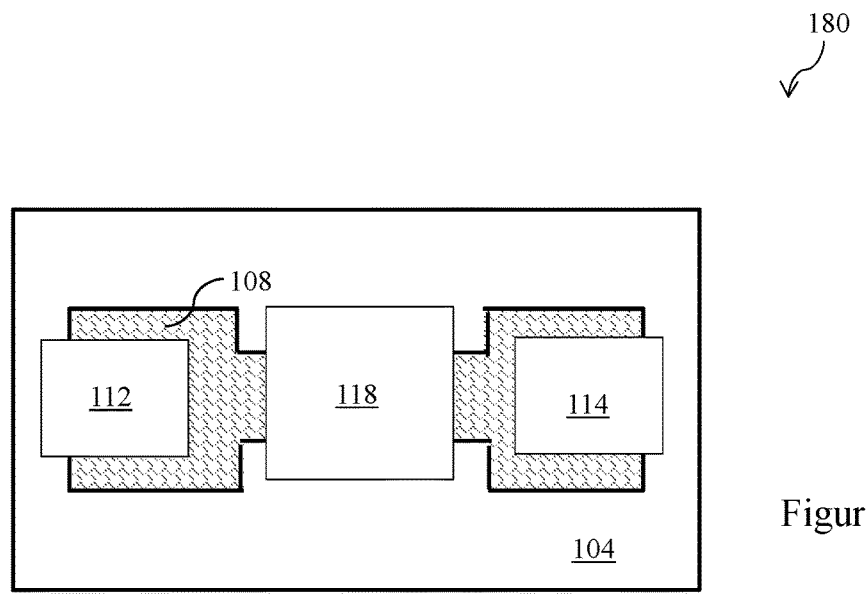

The operation 154 may include more cycles of deposition and sulfurization as needed. In one example as illustrated in FIGS. 9A and 9B, the semiconductor device 180 includes a second barrier layer 182 disposed on the first channel layer 108. A semiconductor device 190 in FIG. 10 also includes a second barrier layer 192 disposed on the first channel layer 108 but is configured differently. A semiconductor device 200 in FIG. 11, the hetero-structure material stack 110 includes five layers of TMD films with two channel layers separated by a barrier layer. Specifically, the hetero-structure material stack 110 in FIG. 11 includes a second barrier layer 192 disposed on the first channel layer 108, a second channel layer 202 disposed on the second barrier layer 192, and a third barrier layer 204 disposed on the second channel layer 202. In this case, five cycles of deposition and sulfurization are implemented sequentially five TMD films.

Thereafter, the operation 153 proceeds to a sub-operation 168 to pattern the TMD films, to form the hetero-structure material stack 110. The hetero-structure material stack 110 includes at least one barrier layer and one channel layer. The barrier and channel layers are TMD films with different transition metals.

After the formation of the hetero-structure 110 by the operation 154, The method 150 proceed to an operation 172 to form source feature 112 and drain feature 114, such as illustrated in FIGS. 3A and 3B, which includes deposition and patterning according some embodiments. For example, the source and drain features may include titanium and gold deposited by sputtering.

The method 150 also includes an operation 174 to form gate stack 120, as illustrated in FIGS. 4A and 4B, by deposition and patterning. The gate stack 120 is disposed on the hetero-structure material stack 110, and is interposed between the source feature 112 and the drain feature 114. As noted above, the operations 174 and 172 may be implemented in a different sequence, such as forming the gate stack 120 first and forming the S/D features thereafter.

Figure 12A:
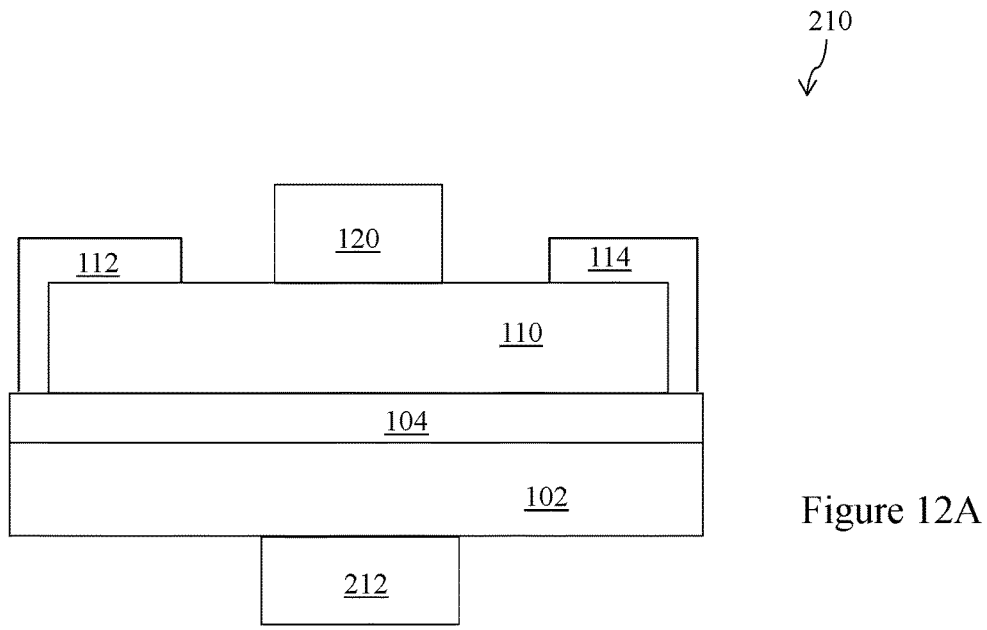
FIGS. 12A and 12B illustrate a sectional view and a top view, respectively, of a semiconductor device in accordance with some embodiments.
Figure 12B:
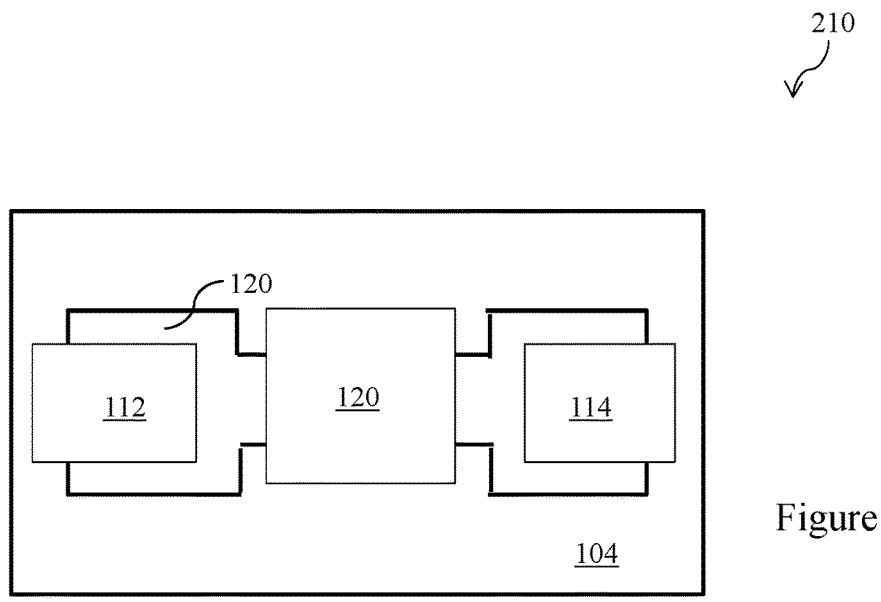

The method 150 may include an operation 176 to form a second gate stack 212 on the backside of the substrate 102, as illustrated in FIGS. 12A and 12B. Thus formed semiconductor device 210 includes double gate for enhanced coupling between channel and gate. The formation of the second gate stack 212 may include deposition and patterning. The second gate stack 212 may be aligned with the first gate stack 120 for optimized channel coupling. In some examples, the second gate stack 212 may be similar to the first gate stack 120 in terms of composition and formation. In some other examples, the second gate stack 212 may be different from the first gate stack 120 in terms of composition and formation. For example, the second gate stack includes some other metal or metal alloy, such as aluminum or silver.

The method 150 may include other operations before, during or after the above described operations. For example, the method 150 may include operations to form various features and components, such as other features for a negative capacitance FET. For examples, an interconnect structure is formed on the substrate 102 and configured to couple various devices into a functional circuit. The interconnection structure includes metal lines distributed in multiple metal layers; contacts to connect the metal lines to devices (such as sources, drains and gates); and vias to vertically connect metal lines in the adjacent metal layers. The formation of the interconnect structure includes damascene process or other suitable procedure. The metal components (metal lines, contacts and vias) may include copper, aluminum, tungsten, metal alloy, silicide, doped polysilicon, other suitable conductive materials, or a combination thereof.

FIGS. 9A and 9B illustrate a sectional view and a top view, respectively, of a semiconductor device 180 in accordance with some embodiments. The semiconductor device 180 include second barrier layer 182 disposed between the channel layer 108 and the gate stack 120. The second barrier layer includes a TMD film, such as tungsten disulfide. The second barrier layer 182 and the gate stack 120 (the gate dielectric layer 116 and the gate electrode layer 118) are collectively patterned to form a stack between the S/D features (112 and 114). The S/D features are disposed on the first channel 108. Furthermore, the bottom surfaces of the S/D features and the second barrier layer 182 are coplanar.

Figure 10:
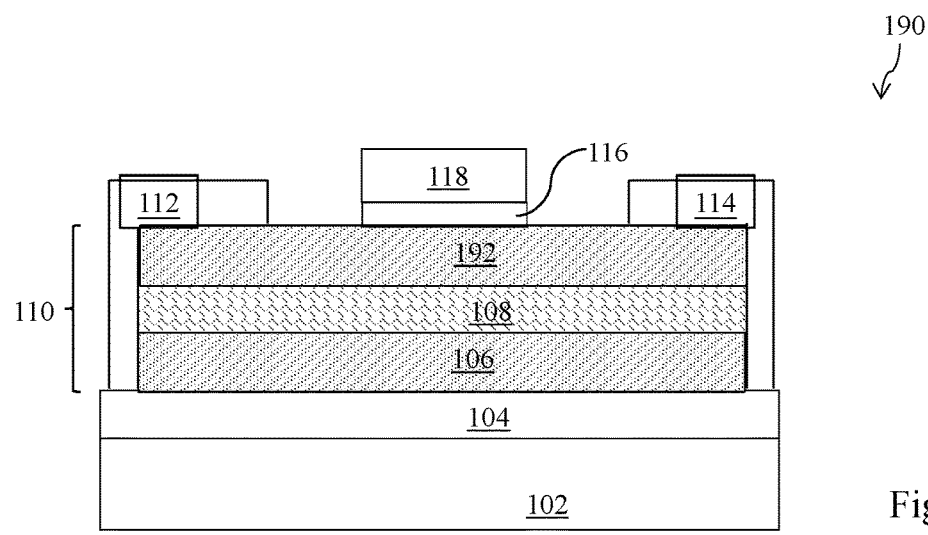
FIGS. 10 and 11 illustrate sectional views of a semiconductor device in accordance with some embodiments.

FIG. 10 illustrates a sectional view of a semiconductor device 190 in accordance with some embodiments. The semiconductor device 190 include second barrier layer 192 disposed between the channel layer 108 and the gate stack 120. The second barrier layer includes a TMD film, such as tungsten disulfide. The second barrier layer 192 and other TMD films (the first barrier layer 106 and the first channel layer 108) are collectively patterned to form the hetero-structure material stack 110. The S/D features are disposed on the second barrier layer 192.

Figure 11:
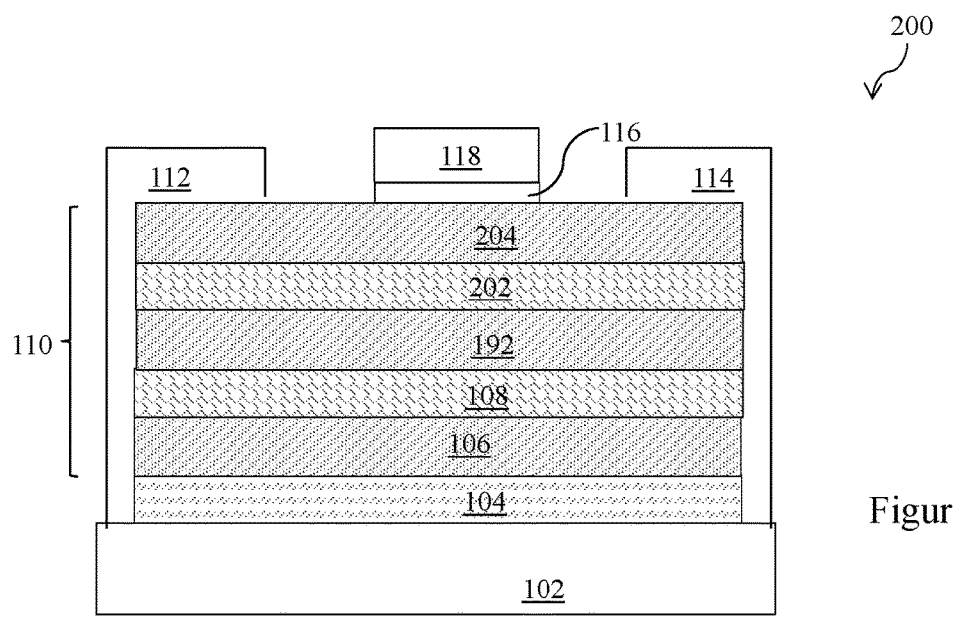

FIG. 11 illustrates a sectional view of a semiconductor device 200 in accordance with some embodiments. The semiconductor device 200 include second barrier layer 192 disposed on the channel layer 108, a second channel layer 202 disposed on the second barrier layer 192, and a third barrier layer 204 disposed on the second channel layer 202. The second channel layer 202 includes a TMD film, such as molybdenum disulfide. The second channel layer 202 is also formed by deposition (such as RF sputtering) and sulfurization. The third barrier layer 204 includes a TMD film, such as tungsten disulfide. All TMD films including three barrier layers (106, 192 and 204) and two channel layers (108 and 202) are collectively patterned to form the hetero-structure material stack 110. The S/D features and the gate stack are disposed on the third barrier layer 204.

FIGS. 12A and 12B illustrate a sectional view and a top view, respectively, of a semiconductor device 210 in accordance with some embodiments. The semiconductor device 210 include a hetero-structure material stack 110 disposed on the substrate 102 (specifically disposed on a dielectric material layer 104 in the present example). The semiconductor device 210 also includes a first gate stack 120 and S/D features (112 and 114) disposed on the hetero-structure material stack 110. The hetero-structure material stack 110 includes at least one barrier layer and one channel layer, such as the stack 110 in FIG. 2A. Alternatively, the stack 110 may include additional barrier layer, additional channel layer or a combination thereof, such as those illustrated in FIGS. 9A, 10, or 11. Furthermore, the semiconductor device 210 includes a second gate stack 212 disposed on the backside of the substrate 102. In the present example, the second gate stack 212 is vertically aligned with the first gate sack 120, thereby defining a channel region. In various examples, the second gate stack 212 may be similar to or alternatively different from the first gate stack 120 in terms of composition and formation.

The present disclosure provides a structure of a semiconductor device and a method making the same in accordance with some embodiments. The semiconductor device includes hetero-structure material stack to define a channel region, and further includes a gate stack and S/D features disposed thereon. Those components are configured to form a high electron mobility transistor. The hetero-structure material stack includes at least one channel layer and at least one barrier layer made of different TMD films. The semiconductor device may include multiple channel layers separated by barrier layers. The semiconductor device may include a second gate stack disposed on the backside of the substrate for enhanced coupling between gate and channel. The disclosed structure and method provide more effective approach with various variations and enhanced material integration. Furthermore, the method provide more freedom to tune the device structure and fabrication in terms of composition, configuration and formation.

Other embodiments and modifications may be implemented without departing from the spirit of the present disclosure. For example, other devices, such as bipolar transistors, diodes, memory cells, imaging sensors, passive devices (such as resistors, capacitors, inductors or a subset thereof), light-emitting device, or a combination thereof, may be formed on the same substrate and function as an integrated circuit. In some embodiments, the hetero-structure material stack may include other TMD material, such as $MoSe_2$ or $WSe_2$. In some embodiments, the hetero-structure material stack may include graphene, graphane, TMD or a combination thereof. For examples, the channel layer may include graphene. In yet other embodiments, each layer of the hetero-structure material stack may be a single atomic layer or a multiple atomic layer, depending on the application and design.

Thus, the present disclosure provides a semiconductor device in accordance with some embodiments. The semiconductor device includes a first transition metal dichalcogenide film on a substrate; a second transition metal dichalcogenide film on the first transition metal dichalcogenide film; source and drain features formed over the second transition metal dichalcogenide film; and a first gate stack formed over the second transition metal dichalcogenide film and interposed between the source and drain features.

The present disclosure provides a semiconductor device in accordance with some embodiments. The semiconductor device includes a first barrier layer disposed on a substrate, wherein the first barrier layer includes a first transition metal dichalcogenide; a first channel layer disposed on the first barrier layer, wherein the first channel layer includes a second transition metal dichalcogenide that is different from the first transition metal dichalcogenide; a source feature and a drain feature formed over the first channel layer; and a first gate stack formed over the first channel layer and interposed between the source and drain features.

The present disclosure provides a method for fabricating a semiconductor device in accordance with some embodiments. The method includes depositing a first transition metal film having a first transition metal on a substrate; performing a first sulfurization process to the first transition metal film, thereby forming a first transition metal sulfide film; depositing a second transition metal film having a second transition metal on the first transition metal sulfide film, wherein the second transition metal is different from the first transition metal; performing a second sulfurization process to the second transition metal film, thereby forming a second transition metal sulfide film; forming a gate stack over the second transition metal sulfide film; and forming source and drain features on the second transition metal sulfide film. The gate stack is interposed between the source and drain features. The gate stack, source and drain features, the first transition metal sulfide film and the second transition metal sulfide film are configured to function as a hetero-structure transistor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising: depositing a first transition metal film having a first transition metal on a substrate; performing a first sulfurization process to the first transition metal film, thereby forming a first transition metal sulfide film; depositing a second transition metal film having a second transition metal on the first transition metal sulfide film, wherein the second transition metal is different from the first transition metal; performing a second sulfurization process to the second transition metal film, thereby forming a second transition metal sulfide film; forming a gate stack over the second transition metal sulfide film; and forming source and drain features on the second transition metal sulfide film, wherein the gate stack is interposed between the source and drain features, wherein the gate stack, source and drain features, the first transition metal sulfide film and the second transition metal sulfide film are configured to function as a hetero-structure transistor, depositing a third transition metal film having the first transition metal on the second transition metal sulfide film; performing a third sulfurization process to the third transition metal film, thereby forming a third transition metal sulfide film; depositing a fourth transition metal film having the second transition metal on the third transition metal sulfide film; performing a fourth sulfurization process to the fourth transition metal film, thereby forming a fourth transition metal sulfide film; depositing a fifth transition metal film having the first transition metal on the fourth transition metal sulfide film; and performing a fifth sulfurization process to the fifth transition metal film, thereby forming a fifth transition metal sulfide film, wherein the forming of the gate stack includes forming the gate stack on the fifth transition metal sulfide film, wherein the forming of the source and drain and the gate stack features includes forming the source and drain and the gate stack features on the top surface of the fifth transition metal sulfide film.

2. The method of claim 1, wherein:
the depositing of the first transition metal film includes depositing tungsten by sputtering; and
the performing of the first sulfurization process includes evaporating sulfur powder at a temperature between 700° C. and 900° C.

3. The method of claim 2, wherein:
the depositing of the second transition metal film includes depositing molybdenum by sputtering; and
the performing of the second sulfurization process includes evaporating sulfur powder at a temperature between 700° C. and 900° C.

4. The method of claim 1, wherein the forming of the gate stack includes:
forming a gate dielectric material layer;
forming a gate electrode material layer on the gate dielectric material layer; and
patterning the gate electrode material layer and the gate dielectric material layer to form the gate stack.

5. The method of claim 1, wherein the forming of the source and drain features includes:
depositing a titanium film;
depositing a gold film on the titanium film; and
patterning the titanium film and the gold film, thereby forming the source and drain features.

6. The method of claim 1, further comprising:
depositing a dielectric layer over the substrate before the depositing of the first transition metal film, wherein the first transition metal film is directly attached to the dielectric layer.

7. The method of claim 1, further comprising:
forming an additional gate stack on the substrate such that the gate stack and the additional gate stack are formed over opposite surfaces of the substrate.

8. The method of claim 1, further comprising:
patterning the first transition metal sulfide film and the second transition metal sulfide film before the forming of the gate stack and the forming of the source and drain features.

9. The method of claim 8, wherein the patterning includes an etch step with an etchant selective to the first transition metal sulfide film, and another etch step with another etchant selective to the second transition metal sulfide film.

10. The method of claim 1, wherein the forming of the source and drain features is performed before the forming of the gate stack.

11. The method of claim 1, wherein the forming of the source and drain features includes a damascene process.

12. A method, comprising: depositing a dielectric layer over a substrate; depositing a first transition metal film having a first transition metal directly on the dielectric layer; performing a first sulfurization process to the first transition metal film, thereby forming a first transition metal sulfide film; depositing a second transition metal film having a second transition metal directly on the first transition metal sulfide film, wherein the second transition metal is different from the first transition metal; performing a second sulfurization process to the second transition metal film, thereby forming a second transition metal sulfide film; forming a gate stack over the second transition metal sulfide film; and forming source and drain features over and in direct contact with the second transition metal sulfide film, wherein the gate stack is interposed between the source and drain features, wherein the gate stack, source and drain features, the first transition metal sulfide film and the second transition metal sulfide film are configured to function as a hetero-structure transistor, depositing a fourth transition metal film having the second transition metal on the third transition metal sulfide film; performing a fourth sulfurization process to the fourth transition metal film, thereby forming a fourth transition metal sulfide film; depositing a fifth transition metal film having the first transition metal on the fourth transition metal sulfide film; and performing a fifth sulfurization process to the fifth transition metal film, thereby forming a fifth transition metal sulfide film, wherein the source and drain features are formed over the fifth transition metal sulfide film and in direct contact with the second, the third, the fourth, and the fifth transition metal sulfide films.

13. The method of claim 12, further comprising:
depositing a third transition metal film having the first transition metal directly on the second transition metal sulfide film; and performing a third sulfurization process to the third transition metal film, thereby forming a third transition metal sulfide film, wherein the source and drain features are formed over the third transition metal sulfide film and in direct contact with the second and the third transition metal sulfide films.

\* \* \* \* \*